United States Patent
Cetel et al.

[11] Patent Number: 6,007,645
[45] Date of Patent: *Dec. 28, 1999

[54] ADVANCED HIGH STRENGTH, HIGHLY OXIDATION RESISTANT SINGLE CRYSTAL SUPERALLOY COMPOSITIONS HAVING LOW CHROMIUM CONTENT

[75] Inventors: Alan D. Cetel, West Hartford; David N. Duhl, Newington, both of Conn.

[73] Assignee: United Technologies Corporation, East Hartford, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/763,916

[22] Filed: Dec. 11, 1996

[51] Int. Cl.$^6$ .................................................. C22C 19/05
[52] U.S. Cl. ........................ 148/404; 148/410; 148/428; 420/448
[58] Field of Search .................... 148/404, 410, 148/428; 420/448

[56] References Cited

U.S. PATENT DOCUMENTS

| | | | |
|---|---|---|---|
| 4,530,885 | 7/1985 | Restall | 428/670 |
| 4,719,080 | 1/1988 | Duhl et al. | 148/404 |
| 4,888,069 | 12/1989 | Duhl et al. | 148/404 |
| 4,935,072 | 6/1990 | Nguyen-Dinh . | |
| 5,035,958 | 7/1991 | Jackson et al. | 428/553 |
| 5,077,141 | 12/1991 | Naik et al. | 428/680 |
| 5,270,123 | 12/1993 | Walston et al. | 428/652 |
| 5,366,695 | 11/1994 | Erickson | 420/448 |
| 5,455,120 | 10/1995 | Walston et al. | 428/652 |
| 5,482,789 | 1/1996 | O'Hara et al. | 148/428 |
| 5,538,796 | 7/1996 | Schaffer et al. | 428/469 |
| 5,540,790 | 7/1996 | Brickson | 148/410 |

FOREIGN PATENT DOCUMENTS

93/24683 12/1993 WIPO .

Primary Examiner—George Wyszomierski
Attorney, Agent, or Firm—John E. Boyd, Esq.; Whitman Breed Abbott & Morgan LLP

[57] ABSTRACT

A superalloy composition and single crystal articles of the composition are disclosed. The broad range, in weight percent, is 3.0–20.0% Co, 5.0–10.0% W, 5.0–7.0% Al, 0.4–2.9% Cr, 4.0–8.0% Ta, 0–1.0% V, 0–8.5% Re, 0–1.5% Ti, 0–3.0% Hf, 0–4.0% Mo, 0–2.0% Nb, 0–10.0% of one or more elements selected from the group consisting of Ru, Rh, Pd, Os, Ir, Pt, 0–1.0 of one or more elements selected from the group consisting of Y, La, Sc, Ce, lanthanides or actinides series of elements, balance essentially Ni. An equation is presented to select the most useful specific compositions from within this range.

20 Claims, 11 Drawing Sheets

ADVANCED HIGH STRENGTH, HIGHLY OXIDATION RESISTANT SINGLE CRYSTAL SUPERALLOY COMPOSITIONS HAVING LOW CHROMIUM CONTENT

TECHNICAL FIELD

This invention relates to nickel base superalloy compositions adapted to be used in cast single crystal form and to single crystal articles.

BACKGROUND INFORMATION

Nickel base superalloys are widely used in applications where high stresses must be endured at elevated temperatures. One such application is in the gas turbine engine industry, especially for turbine blades and vanes. Demands for improved efficiency and performance have resulted in the operation of gas turbine engines at increasingly elevated temperatures placing extreme demands on the superalloy articles used therein.

Conventionally prepared metallic materials are comprised of a plurality of grains which are separated by grain boundaries. The grain boundaries are weak at elevated temperatures, much weaker than the material within the grains. Such grain boundaries are prominent sites for crack initiation at elevated temperatures. Accordingly, elimination of high angle grain boundaries reduces the propensity for crack formation which in turn increases component life at elevated temperatures.

One approach which has been successfully employed is to fabricate the metallic materials in the form of single crystals. Through specific casting techniques nickel base superalloys can be produced in single crystal form, that is, in the form of articles which have no internal grain boundaries. U.S. Pat. No. 3,260,505 describes nickel base single crystal superalloy articles. U.S. Pat. No. 4,116,723 describes a heat treatment method applicable to a class of nickel single crystal articles. U.S. Pat. No. 4,209,348 describes a more specific class of single crystal articles and describes a method for heat treating such articles to improve their elevated temperature mechanical properties. The nominal composition disclosed in the '348 patent, in weight percent, is 10% chromium, 5% aluminum, 1.5% titanium, 4% tungsten, 12% tantalum, 5% cobalt, balance essentially nickel. Another single crystal superalloy composition is that which is described in U.S. Pat. No. 4,402,772 having a nominal composition, in weight percent, of 6% tantalum, 9% chromium, 5% cobalt, 1% titanium, 1% molybdenum, 7% tungsten, 5.5% aluminum, 0.15% hafnium, balance essentially nickel. Yet another composition is that described in U.S. Pat. No. 4,222,794 having a nominal composition, in weight percent, of 5.2% chromium, 5.4% aluminum, 1.1 % titanium, 2% molybdenum, 4.9% tungsten, 6.4% tantalum, 3% rhenium, 0.4% vanadium, balance essentially nickel. Still another composition is that which is described in U.S. Pat. No. 4,719,080 having an exemplary and preferred composition, in weight percent of, 5% chromium, 2% molybdenum, 6% tungsten, 3% rhenium, 9% tantalum, 5.6% aluminum, 10% cobalt, 0.1% hafnium, balance essentially nickel.

DISCLOSURE OF THE INVENTION

The invention comprises a nickel base superalloy composition which can be fabricated into single crystal articles having an exceptional combination of properties. The broad compositional range, in weight percent, is 3.0–20.0% cobalt, 5.0–10.0% tungsten, 5.0–7.0% aluminum, 0.4–2.9% chromium, 4.0–8.0% tantalum, 0–1.0% vanadium, 0–8.5% rhenium, 0–1.5% titanium, 0–3.0% hafnium, 0–4.0% molybdenum, 0–2.0% niobium, 0–10.0% of one or more elements selected from the group consisting of group III, series 2 and 3 metals (ruthenium, palladium, platinum, rhodium, iridium and osmium), 0–1.0% of one or more elements selected from the group consisting of yttrium, lanthanum, scandium, cerium, lanthanide or actinide series of elements, balance essentially nickel. A compositional relationship is described which can guide one skilled in the art to the selection of an optimum composition within the broad range.

A unique characteristic of the alloy described herein is the excellent oxidation resistance and good hot corrosion resistance despite a low chromium content. The low chromium content also enables the alloy to have a high creep-rupture strength and good microstructural stability. Accordingly, the invention is particularly suited for gas turbine engine components, such as blades and vanes.

Other features and advantages of the invention will be apparent from the Best Mode and from the accompanying drawings.

BEST MODE FOR CARRYING OUT THE INVENTION

Figure 1:
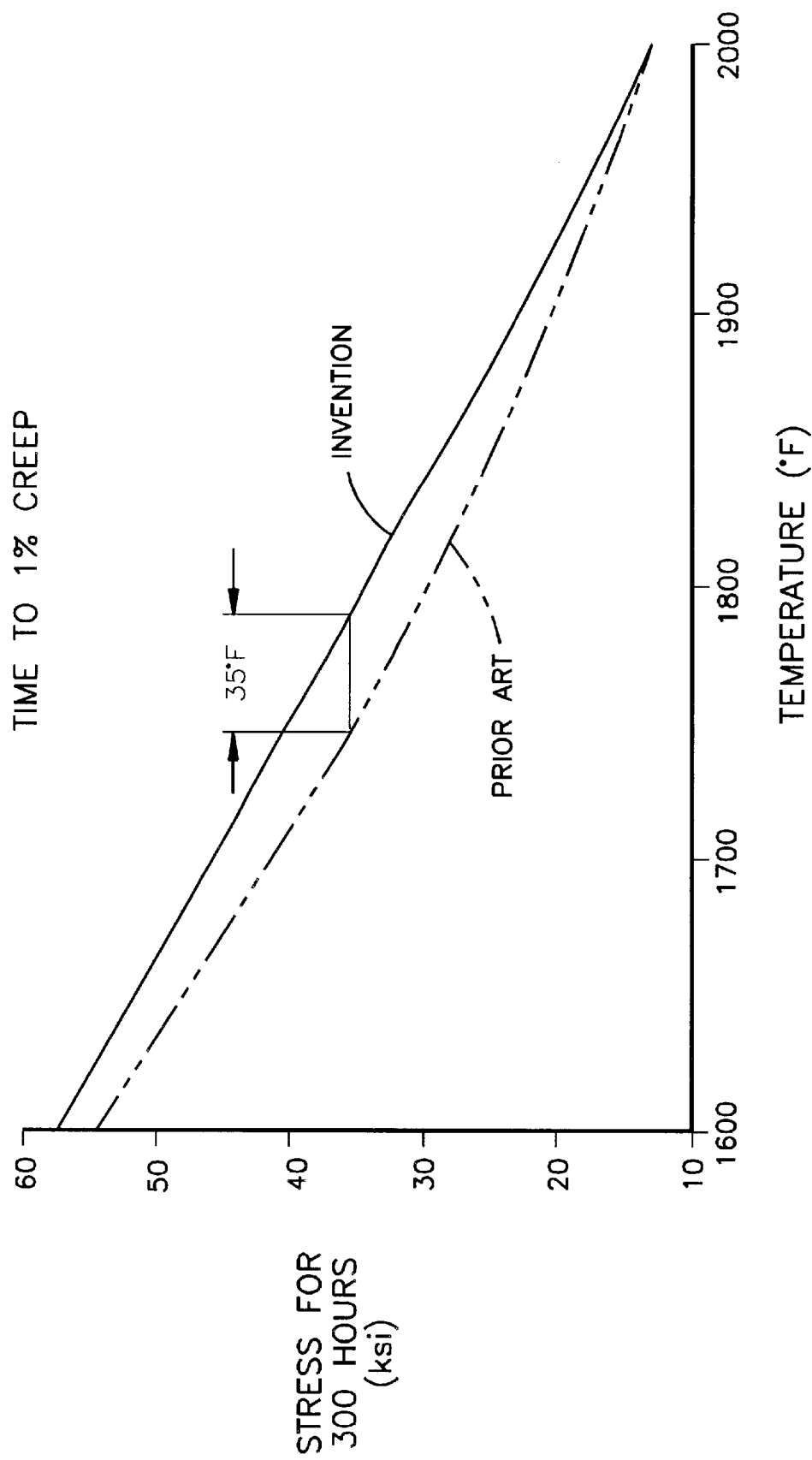
FIG. 1 is a graph which illustrates the stress required to produce 1% creep in 300 hours as a function of temperature for the inventive alloy and a prior art alloy.

Table 1 lists several compositional ranges of varying scope for the composition of the single crystal nickel base superalloys of the invention. The superalloys of the inventive composition are developed with certain requirements in mind such as oxidation resistance, corrosion resistance, and mechanical properties to enable the articles made from them to withstand the harsh environment of gas turbine engine operation.

Resistance to oxidation and corrosion is largely determined by the nature of the oxide layer which forms on the surface of the alloy. The layer contains substantial amounts of aluminum which forms an external alumina scale during engine operation at elevated temperatures. The alumina may be mixed with other oxides depending upon the test conditions. Yttrium or other reactive elements may be present in the inventive alloy to maintain the integrity of the alumina scale which enhances oxidation resistance.

In addition to providing oxidation and corrosion resistance, the aluminum serves as the primary gamma prime forming element in the alloy composition. The gamma prime phase, $Ni_3Al$, is the phase which significantly contributes to the strength of nickel base superalloys.

In addition to aluminum as a gamma prime former, the invention includes tantalum which is another strong gamma prime former. These gamma prime formers, primarily tantalum and aluminum, are present in a sufficient amount to form from about 60 to 70 percent by volume of a gamma prime strengthening phase.

Other elements such as titanium and vanadium are gamma prime formers, but their amount in the inventive alloy is minimized. Employing titanium or vanadium will limit the amount of aluminum which can be used as a gamma prime former and will thereby effectively reduce the oxidation resistance of the material. The amount of vanadium and titanium employed is also kept at a minimum because vanadium may be detrimental to hot corrosion resistance and titanium may be detrimental to oxidation resistance.

When present, platinum, palladium, ruthenium and osmium are also effective in increasing the creep-rupture strength and oxidation and corrosion resistance of the material.

A unique characteristic of the inventive alloy is the excellent oxidation esistance exhibited by this alloy, combined with good hot corrosion resistance despite a low chromium content. A single crystal alloy having such properties at chromium contents as low as 0.4 wt % has not been known before to the inventors' knowledge. The chromium content may be, in weight percent, between about 0.4%–2.9%, and most preferably between about 1.0%–1.75%. A significant benefit of such low chromium content is that it enables the addition of more refractory elements, such as tungsten, rhenium and molybdenum needed for high temperature creep strength, while maintaining microstructural stability. The refractory elements, molybdenum, tungsten and rhenium are present to act as solid solution strengtheners in the gamma matrix which helps improve high temperature creep strength.

The inventive composition will be conventionally cast in single crystal form according to the teachings of various prior art patents including U.S. Pat. Nos. 3,700,023; 3,763,926 and 4,190,094 which are incorporated herein by reference. The compositions and single crystal articles of the present invention may be given a heat treatment in accordance with the teachings of U.S. Pat. No. 4,116,723 which is also incorporated herein by reference. A preferred heat treatment is a solution treatment between about 0.5 hours and about 4 hours at a temperature between about 2375° F. and about 2425° F. followed by rapid air cooling to ambient, then a heat treatment at 1975° F. for 4 hours. The final step is a heat treatment at about 1300° F. for about 24 hours.

Within the broad range presented in Table I a particular relationship should be obeyed to obtain optimum properties. That relationship is:

$$P = -200\ Cr + 80\ Mo - 20\ Mo^2 + 200\ W - 14\ W^2 + 30\ Ta - 1.5\ Ta^2 + 2.5\ Co + 1200\ Al - 100\ Al^2 + 100\ Re + 1000\ Hf - 2000\ Hf^2 + 700\ Hf^2$$

where $P \geq 4500$

All elemental values in this equation are weight percent values. The value P given by the equation is a parameter which predicts the overall merit of the composition, especially high temperature creep-rupture strength. Compositions with P values greater than or equal to 4500 and which fall within the ranges set forth in Table I will have superior qualities of high creep strength in combination with stability, heat treatability and resistance to oxidation and corrosion. Alloys within the Intermediate A range and which have a P value greater than or equal to 4700 are particularly advantageous. Similarly, alloys within the Intermediate B range and which have a P value greater than or equal to 4800 are particularly advantageous as are alloys within the Preferred range and which have a P value greater than or equal to 4900.

TABLE I (Weight Percent)

|  | Broad | Intermediate A | Intermediate B | Preferred |
|---|---|---|---|---|
| W | 5.0–10.0 | 6.0–8.0 | 6.3–7.3 | 6.3–7.3 |
| Co | 3.0–20.0 | 5.0–15.0 | 7.0–13.0 | 7.0–13.0 |
| Cr | 0.4–2.9 | 0.8–2.5 | 1.0–2.0 | 1.0–1.75 |
| Ta | 4.0–8.0 | 5.0–7.0 | 5.5–6.5 | 5.5–6.5 |
| Al | 5.0–7.0 | 5.3–6.3 | 5.7–6.3 | 5.7–6.3 |
| V | 0–1.0 | 0–1.0 | 0–0.5 | 0 |
| Re | 0–8.5 | 5.0–7.5 | 6.0–7.0 | 6.0–7.0 |
| Ti | 0–1.5 | 0–1.0 | 0–1.0 | 0 |
| Hf | 0–3.0 | 0.1–1.5 | 0.3–0.5 | 0.3–0.5 |
| Mo | 0–4.0 | 0.5–3.0 | 1.5–2.5 | 1.5–2.5 |
| Nb | 0–2.0 | 0–1.0 | 0–1.0 | 0 |
| (Ru,Rh,Pd, Os,Ir,Pt) | 0–10.0 | 0–10.0 | 0–10.0 | 0–10.0 |
| (Y,La,Sc,Ce, Lanthanides or Actinides) | 0–1.0 | 0.001–0.05 | 0.001–0.05 | 0.001–0.05 (Y) |

Amounts from 0–0.1% of the latter elemental listing (Y, La, Sc, Ce, Lanthanides or Actinides) may also be present.

Amounts from 0–1.0% of the latter elemental listing (Y, La, Sc, Ce, Lanthanides or Actinides) may also be present.

Table II sets forth a series of exemplary compositions within the broad compositional range of the invention which were evaluated in single crystal form. Also shown in Table II are the P values derived from the previously described equation for the exemplary compositions set forth therein.

TABLE II (Weight Percent)

| Alloy | Cr | Mo | W | Re | Ta | Al | Hf | Co | Yppm | Ni | P value |
|---|---|---|---|---|---|---|---|---|---|---|---|
| B76 | 1.5 | 2.0 | 6.1 | 7.2 | 5.8 | 5.8 | 0.4 | 10.1 | 200 | Bal | 5069 |
| B77 | 1.6 | 2.0 | 7.0 | 6.1 | 5.8 | 5.8 | 0.4 | 10.1 | 50 | Bal | 4954 |

TABLE II-continued (Weight Percent)

| Alloy | Cr | Mo | W | Re | Ta | Al | Hf | Co | Yppm | Ni | P value |
|---|---|---|---|---|---|---|---|---|---|---|---|
| B78 | 1.5 | 2.0 | 9.9 | 5.1 | 5.9 | 5.9 | 0.4 | 10.1 | 40 | Bal | 4772 |
| B94-2 | 1.4 | 2.4 | 6.7 | 6.4 | 5.8 | 5.8 | 0.4 | 10.1 | 80 | Bal | 5018 |
| B95-1 | 2.8 | 2.1 | 7.0 | 6.5 | 5.9 | 5.9 | 0.4 | 10.2 | 110 | Bal | 4758 |
| B66 | 1.6 | 2.0 | 8.9 | 4.9 | 5.8 | 5.8 | 0.1 | 10.0 | — | Bal | 4746 |
| B96-2 | 1.5 | 2.0 | 7.0 | 8.4 | 6.0 | 5.9 | 0.4 | 10.1 | 60 | Bal | 5209 |
| B113-5 | 1.0 | 2.0 | 6.4 | 6.5 | 5.9 | 5.8 | 0.4 | 10.2 | 230 | Bal | 5108 |
| ** | 5.0 | 1.9 | 5.9 | 3.0 | 8.7 | 5.65 | 0.10 | 10.0 | — | Bal | 3913 |

** Prior art alloy of U.S. Pat. No. 4,719,080

Table III sets forth some of the more significant properties of some of the single crystal compositions described in Table II.

TABLE III

| Alloy | 1650° F. Hot Cor.* Resistance | 2100° F. Uncoated Oxidation* Life | 1900° F. 36 ksi 1% Creep | 1900° F. 36 ksi Rupture Life | Temp. Advantage Over Prior Art* (° F.) | | |
|---|---|---|---|---|---|---|---|
| | | | | | 1900° F. 36 ksi 1% Creep | 1900° F. 36 ksi Rupture Life | 2100° F. Uncoat. Oxid. Life |
| B66 | comparable | — | 38 hrs | 92 hrs | 56° F. | 47° F. | — |
| B76 | 0.7X | 3.2X | 34 hrs | 84 hrs | 51° F. | 43° F. | 125° F. |
| B77 | comparable | 3.8X | 35 hrs | 86 hrs | 51° F. | 44° F. | 140° F. |
| B78 | comparable | 3.3X | 49 hrs | 110 hrs | 68° F. | 55° F. | 130° F. |
| B94-2 | comparable | 3.0X | 41 hrs | 102 hrs | 59° F. | 51° F. | 120° F. |
| B95-1 | comparable | 6.8X | 38 hrs | 93 hrs | 56° F. | 47° F. | 200° F. |
| B113-5 | 0.7X | 4.1X | 36 hrs | 81 hrs | 52° F. | 40° F. | 150° F. |

*Relative to prior art alloy of U.S. Pat. No. 4,719,080

An alloy of the invention within the most preferred compositional range disclosed in Table I will be contrasted with the properties of a prior art alloy described in U.S. Pat. No. 4,719,080. This prior art alloy, in weight percent, 5.0 Cr, 10.0 Co, 1.9 Mo, 5.9 W, 3.0 Re, 8.7 Ta, 5.65 Al, 0.10 Hf, bal Ni is regarded as being among the best of the (prior art) single crystal alloys in terms of overall properties.

Figure 2:
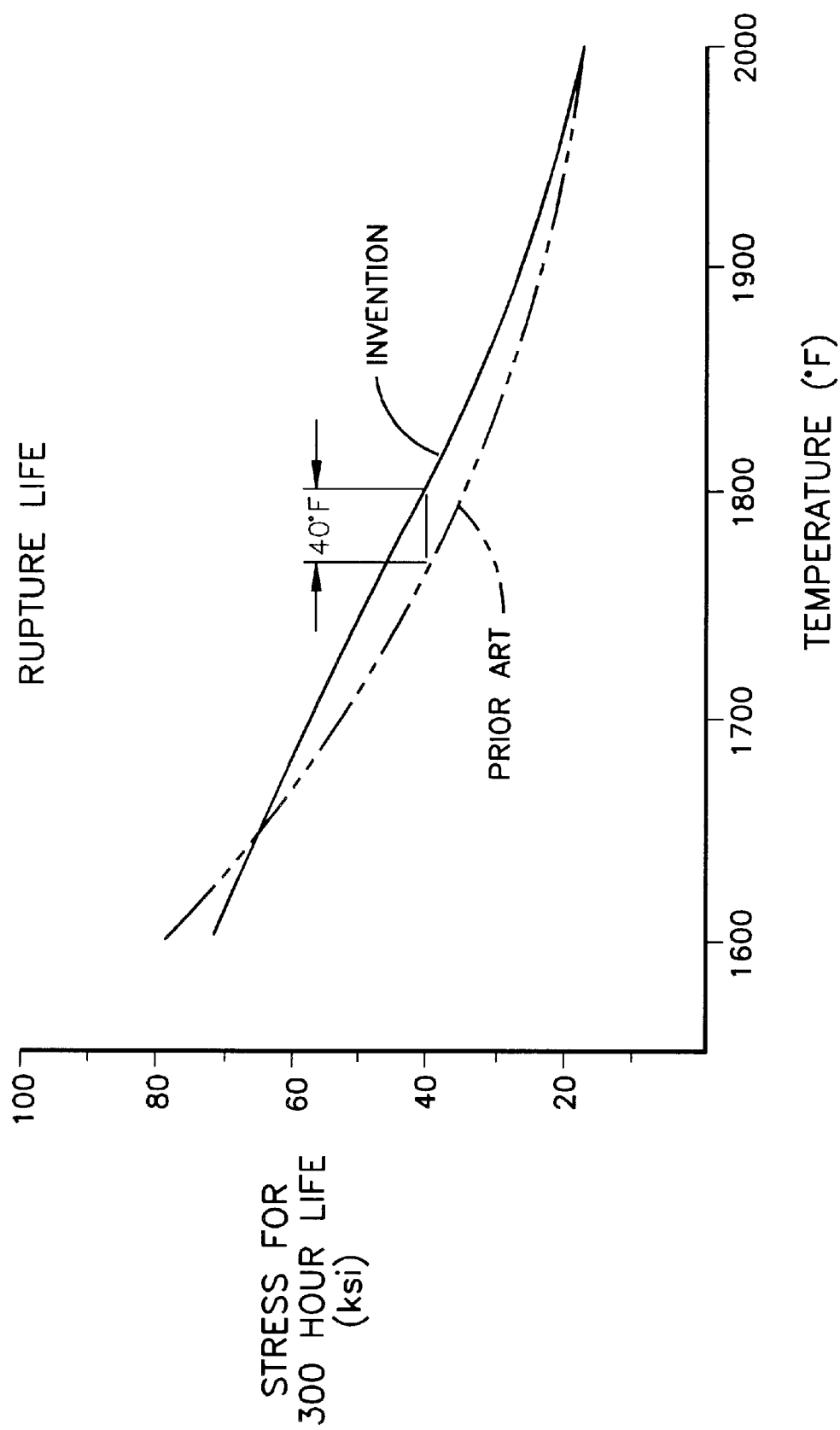
FIG. 2 is a graph which shows the stress required to produce rupture in 300 hours as a function of temperature for the inventive alloy and a prior art alloy.

FIGS. 1 and 2 show, respectively, the stress required to produce 1% creep and rupture in 300 hours as a function of temperature. In FIGS. 1 and 2 it can be seen that the inventive alloy has about a 35–40° F. temperature advantage over the prior art composition. This means that in an application where rupture life or creep was the controlling factor, the inventive alloy could be used at a temperature about 35–40° F. greater than the prior art alloy while obtaining equivalent life. This improvement in temperature capability can be exploited in various ways. For example, operation at an increased temperature can produce increased thrust or efficiency. Also, at a given operating temperature a significant improvement in life over the prior art alloy can be seen. For example, at the conditions listed above in Table III (1900° F./36 ksi) the prior art alloy has approximately a 40 hour rupture life and approximately a 14 hour 1% creep life. Thus, the inventive alloys listed in Table III have approximately a 3x improvement in time to 1% creep and approximately a 2.5x improvement in rupture life in comparison to the prior art alloy. These results are significant, particularly because it is an improvement over a prior art alloy regarded as among the best in overall properties.

Figure 3:
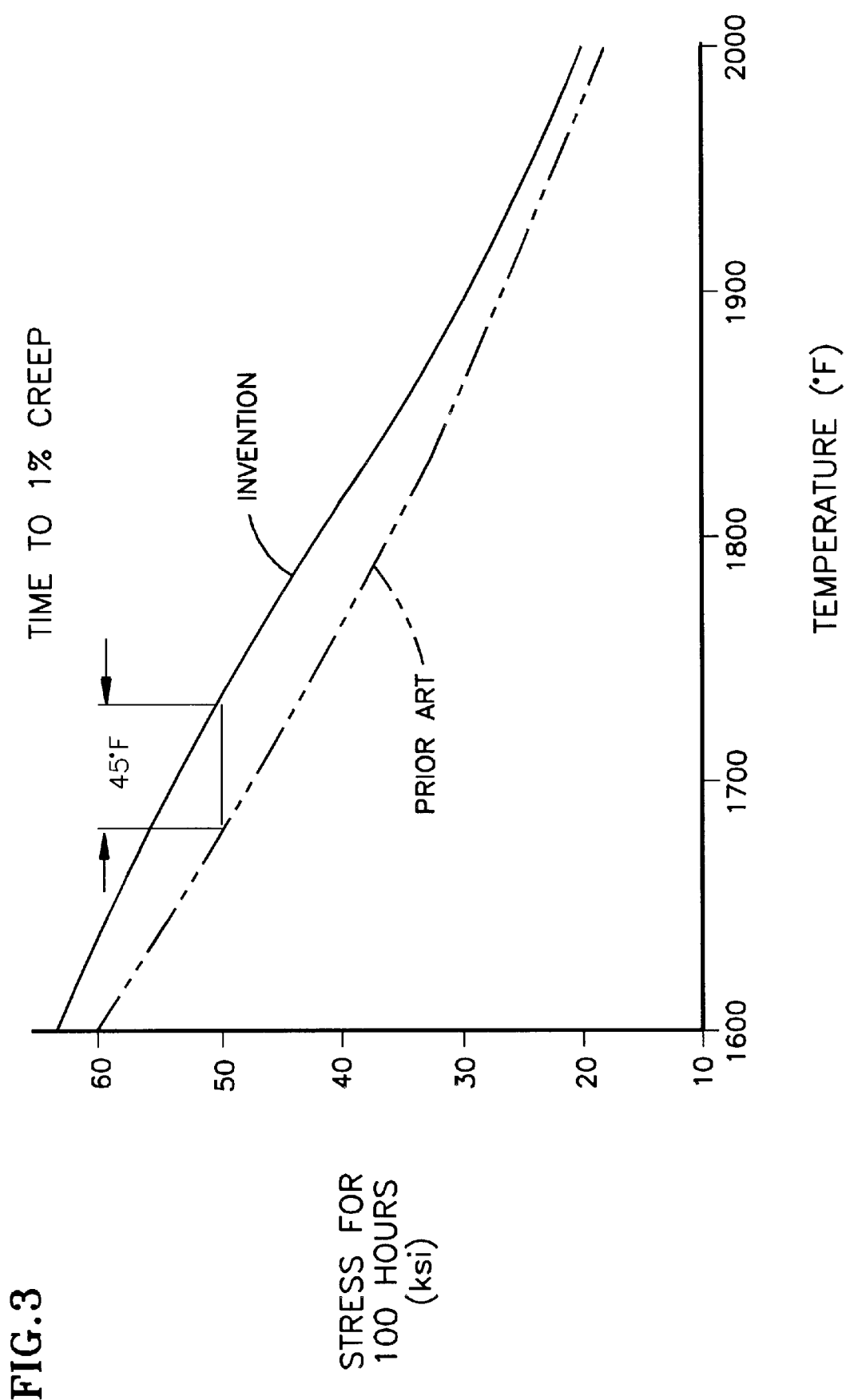
FIG. 3 is a graph which illustrates the stress required to produce 1% creep in 100 hours as a function of temperature for the inventive alloy and a prior art alloy.
Figure 4:
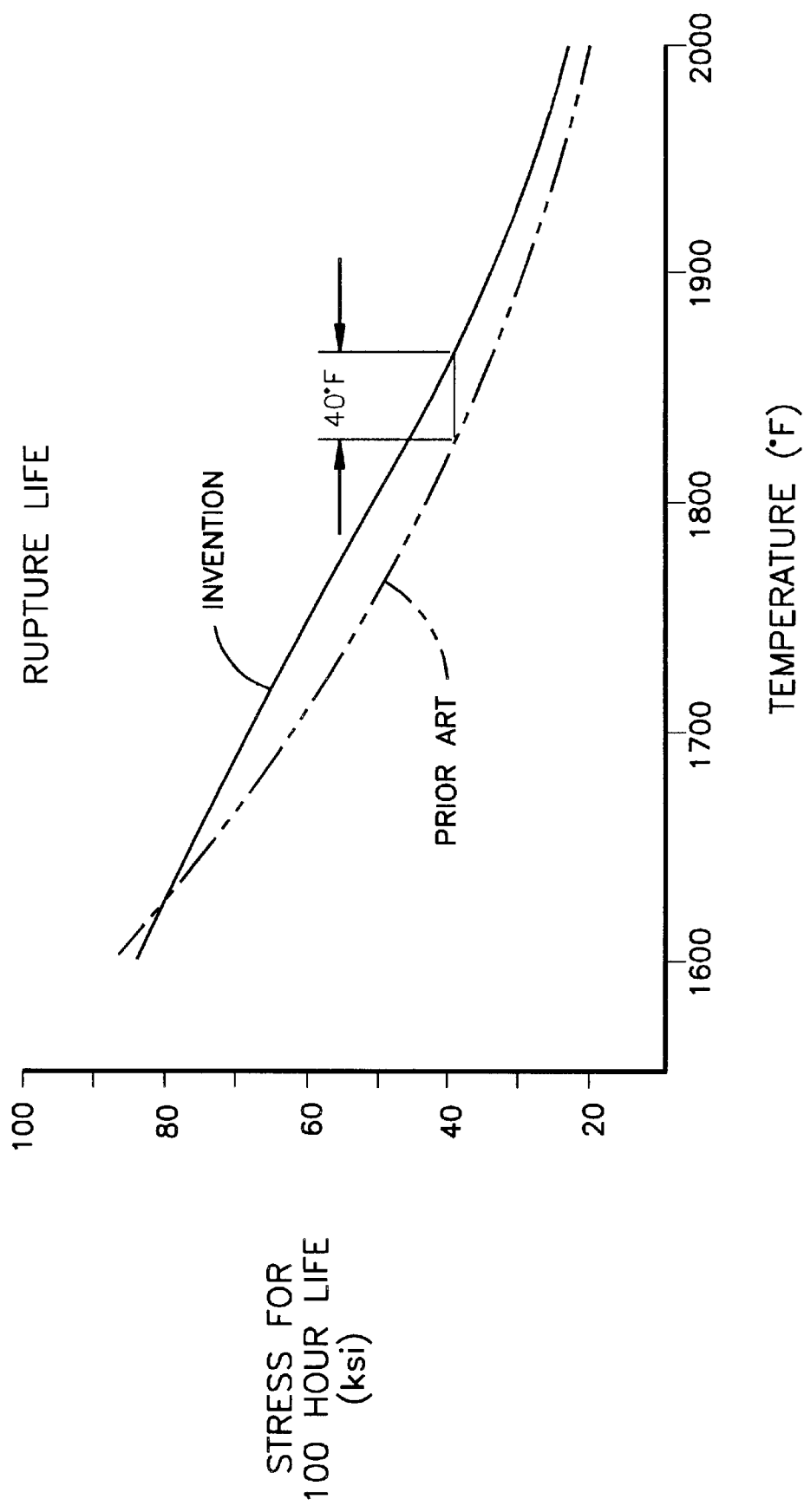
FIG. 4 is a graph which shows the stress required to produce rupture in 100 hours as a finction of temperature for the inventive alloy and a prior art alloy.

FIGS. 3 and 4 show, respectively, the stress required to produce 1% creep and rupture in 100 hours as a function of temperature. In FIG. 3 it can be seen that the inventive alloy has up to about a 45° F. temperature advantage over the prior art alloy, wherein in FIG. 4 it can be seen that in rupture life the inventive alloy has a temperature advantage of about 40° F. over the prior art alloy. This means that in an application where rupture life or creep was the controlling factor, the inventive alloy could be used at a temperature about 40–45° F. greater than the prior art alloy while obtaining equivalent life. As shown in the figures, one skilled in the art would recognize that the temperature advantage varies depending upon temperature and stress conditions where the comparisons are made.

Figure 5:
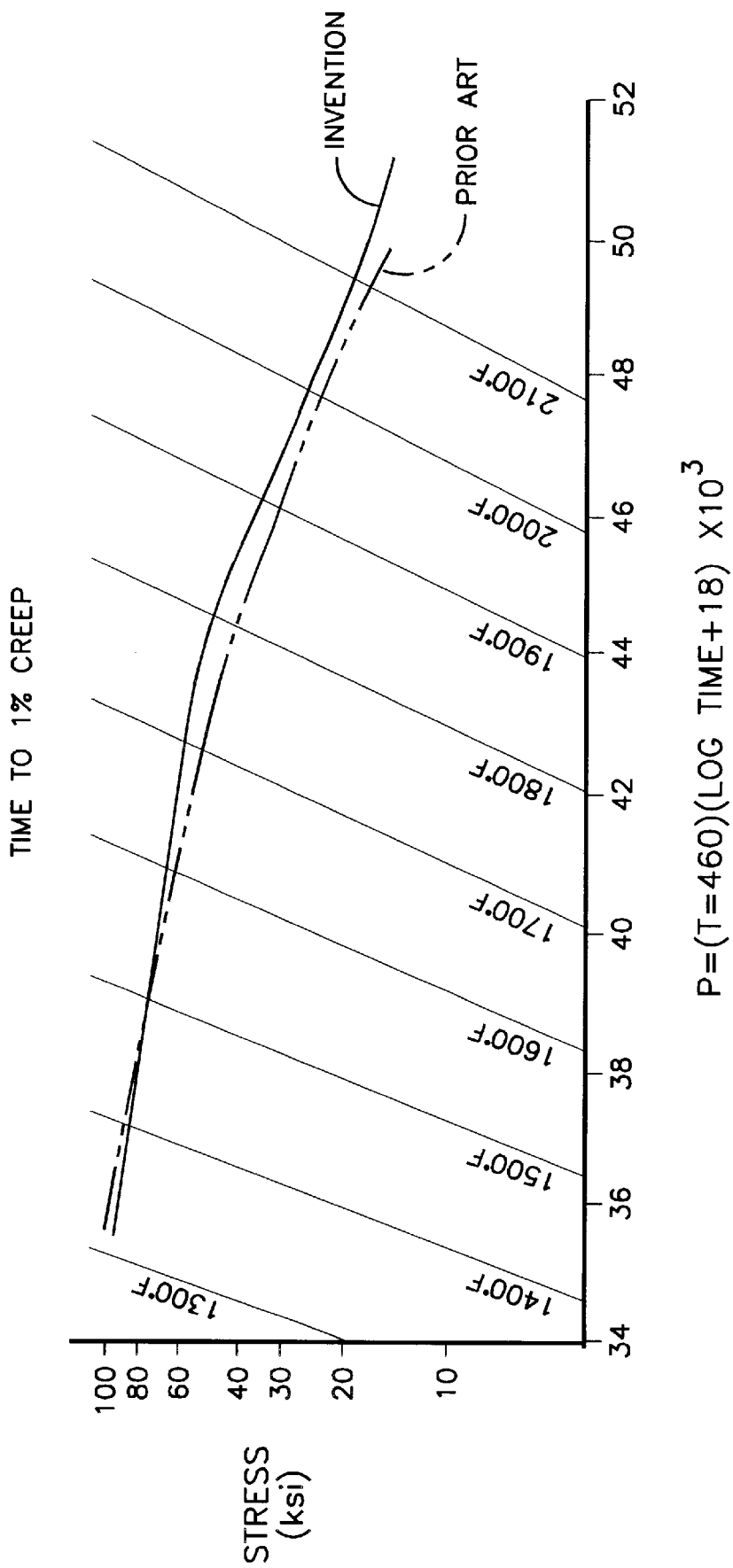
FIG. 5 is a Larson-Miller plot of the time to 1% creep compared to a prior art alloy.
Figure 6:
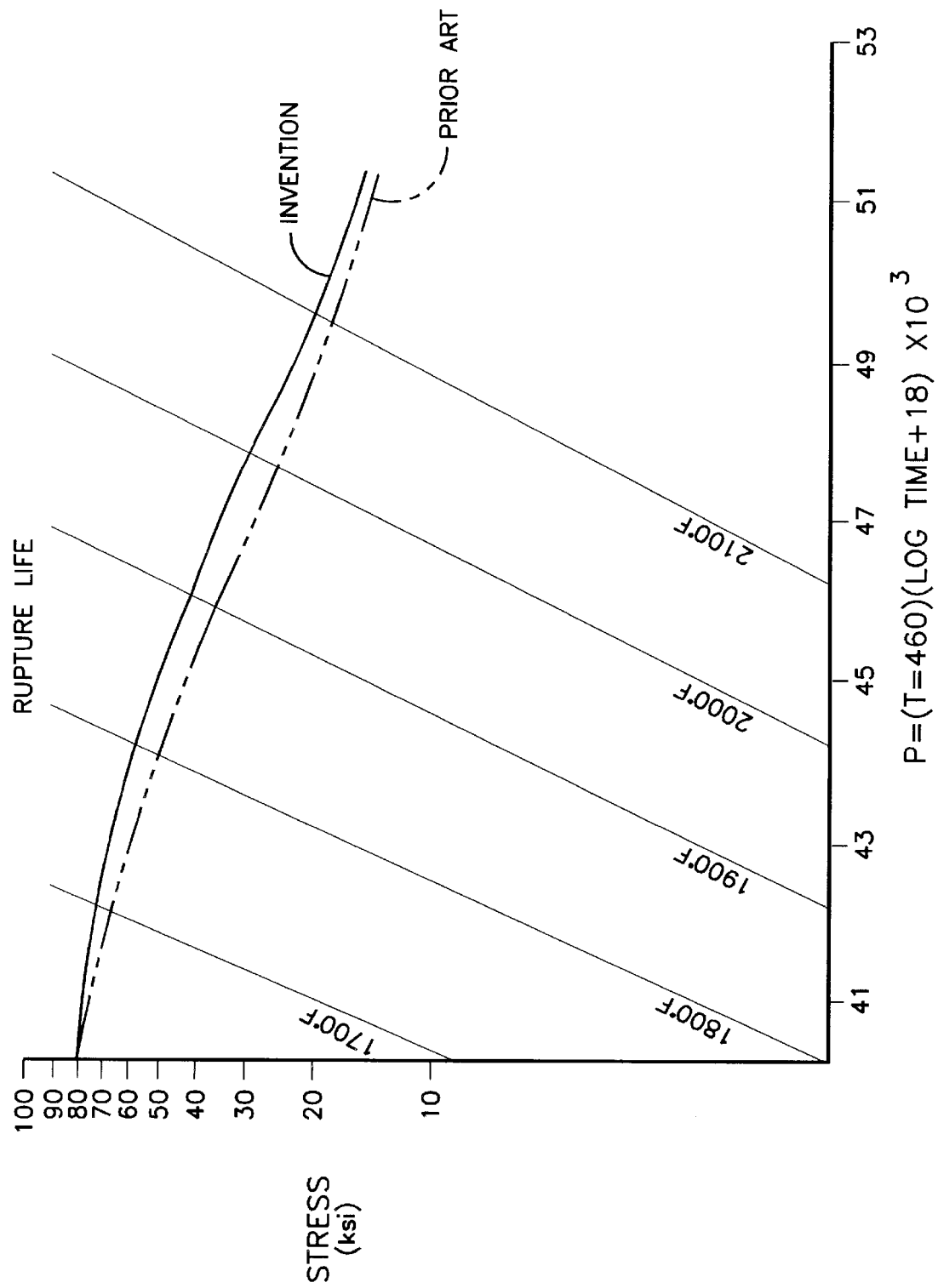
FIG. 6 is a Larson-Miller plot of the time to rupture compared to a prior art alloy.

FIG. 5 shows a plot of the stress required to produce 1% creep as a finction of the Larson-Miller parameter which combines time and temperature effects on creep life. It can be seen to one skilled in the art that the invention has the largest temperature advantage over the prior art in the 1750–1900° F. temperature range. A temperature advantage can be seen in the temperature range of 1650–2000° F. as well, although it is most pronounced in the 1750–1900° F. range. FIGS. 1–4 further show this temperature advantage. The same comments may be made with respect to FIG. 6 which shows the stress required to produce rupture as a finction of the previously-mentioned Larson-Miller parameter.

Figure 7:
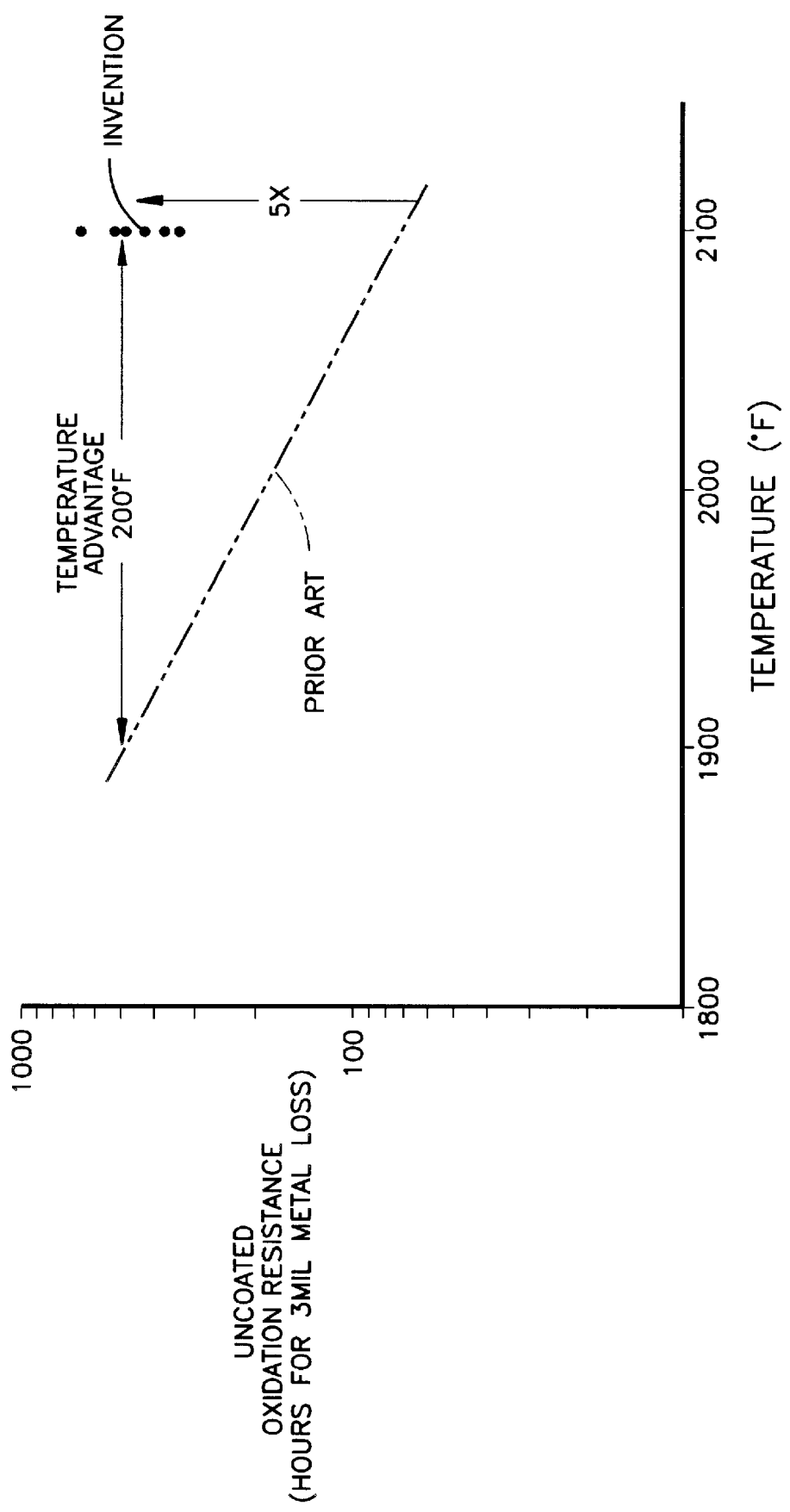
FIG. 7 is a chart comparing the oxidation behavior of the inventive alloy with that of a prior art alloy.

FIG. 7 is a graph illustrating the uncoated oxidation behavior of the prior art composition and that of the invention. The chart shows the time required to produce a 3 mil deep oxidation attack on samples tested at 2100° F. The data on the chart was derived from cyclic burner rig tests in which samples were exposed to a high temperature flame, produced by the combustion of jet fuel, alternating with a cooling cycle. This produces a severe environment which is representative of turbine blades operating in gas turbine engines. From FIG. 7 it can be seen that the invention has up to about a 225° F. advantage over the prior art in terms of temperature at which an identical metal loss would be observed. Alternately, for a given temperature, i.e. 2100° F., the prior art composition would lose about 3 mils of metal in about 70–75 hours whereas the inventive composition would lose that amount of material in about 400 hours. In other words, the life of the inventive alloy with respect to oxidation behavior would be increased by a factor of about 5× in comparison to the prior art alloy. This excellent oxidation resistance means that the alloy of the invention may perform well during service in certain applications without the need of a protective coating.

Yet another material property is hot corrosion resistance. In this respect the invention has comparable performance to that of the prior art composition. Some relative data obtained at 1650° F. in burner rig testing with synthetic sea salt introduced into the combustion flame can be found in Table III.

In order to achieve satisfactory levels of properties in all of the areas discussed above, the nickel base superalloys to date (prior art alloys) are typically coated with a material such as an aluminide coating or an MCrAlY coating to improve the oxidation resistance and hot corrosion resistance of the superalloy. However, the trade off to these improved properties which must be accounted for is a debit in fatigue life of the components because the coatings have lower ductility than the base single crystal alloys.

Figure 8:
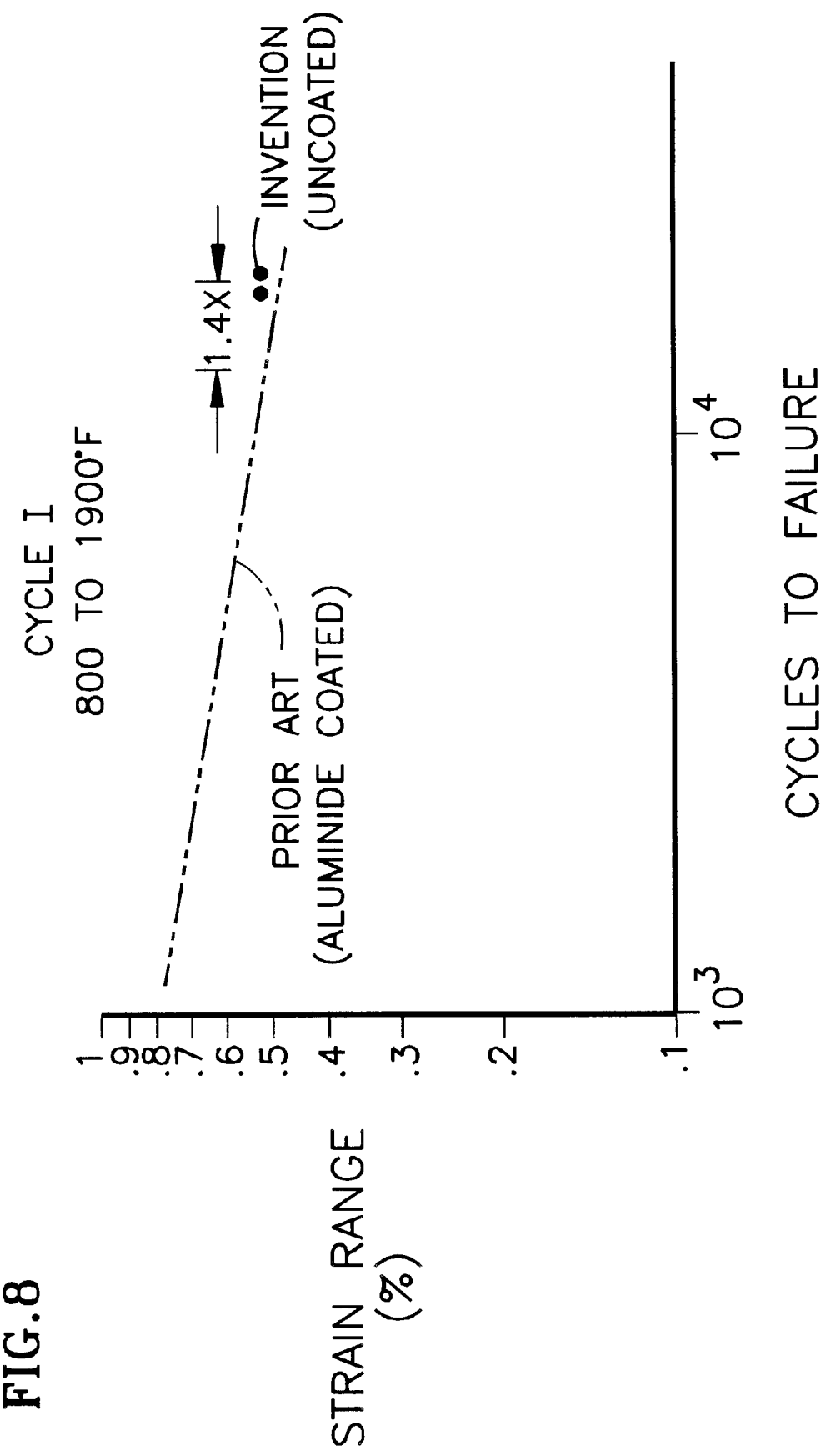
FIG. 8 is a plot illustrating the thermo-mechanical fatigue behavior at 1900° F. of the inventive alloy (uncoated) as contrasted with that of the prior art alloy (coated).
Figure 9:
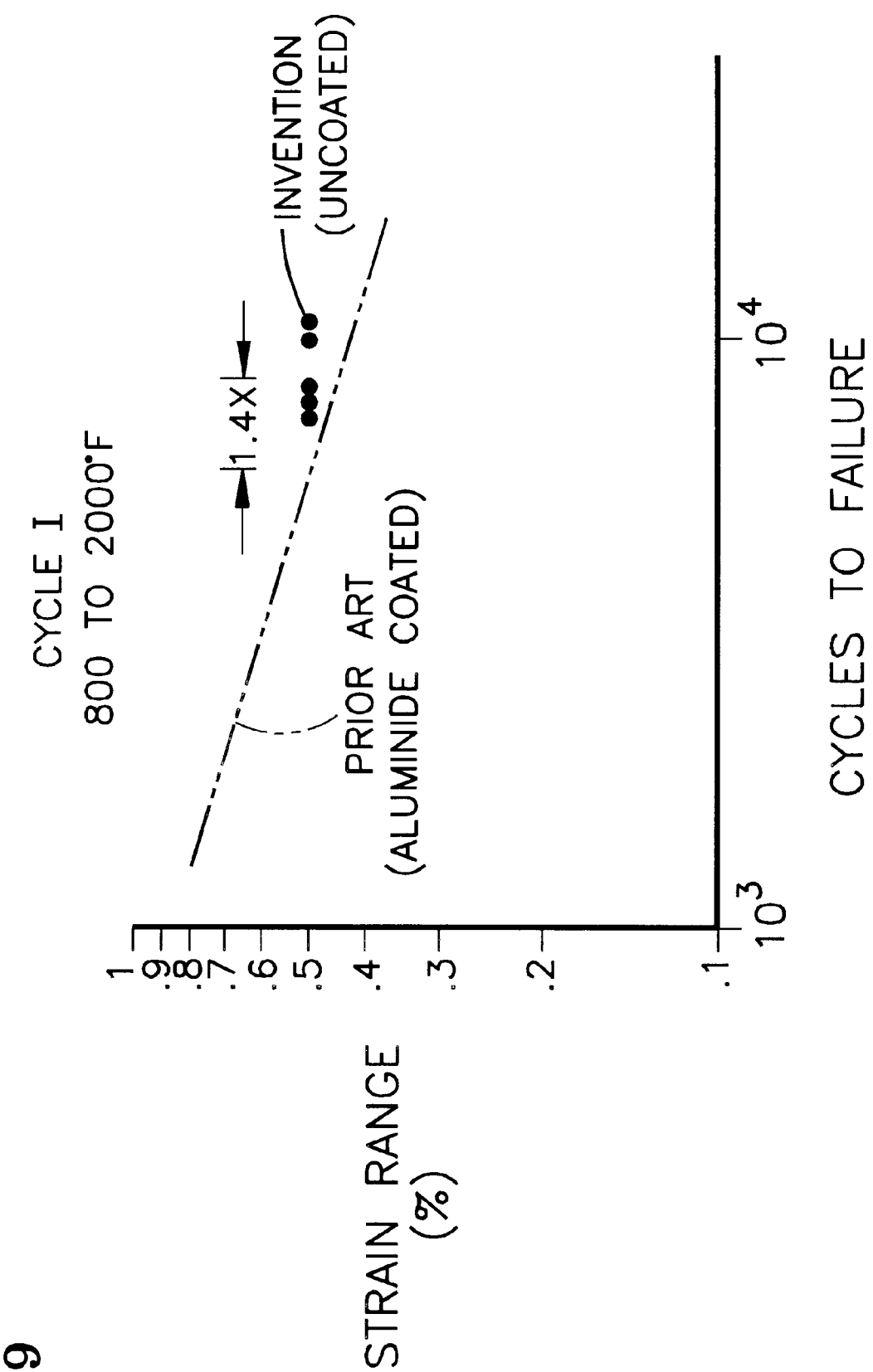
FIG. 9 is a plot illustrating the thermo-mechanical fatigue behavior at 2000° F. of the inventive alloy (uncoated) as contrasted with that of the prior art alloy (coated).

FIGS. 8 and 9 illustrate the thermal fatigue life superiority of the invention in an uncoated state over the prior art alloy requiring a coating for oxidation protection at elevated temperatures. Testing was conducted using an out of phase cycle in which the samples were placed in compression at the maximum cycle temperature and put in tension at the minimum cycle temperature of 800° F. The prior art alloy was coated on its external surface with a 2.5 mil layer of aluminide coating (aluminum content, in weight percent, of approximately 25%) as described in U.S. Pat. No. 4,132,816, the contents of which are herein incorporated by reference. It should be noted that aluminide coatings have inherently greater fatigue resistance than most other suitable metallic coatings.

Figure 10:
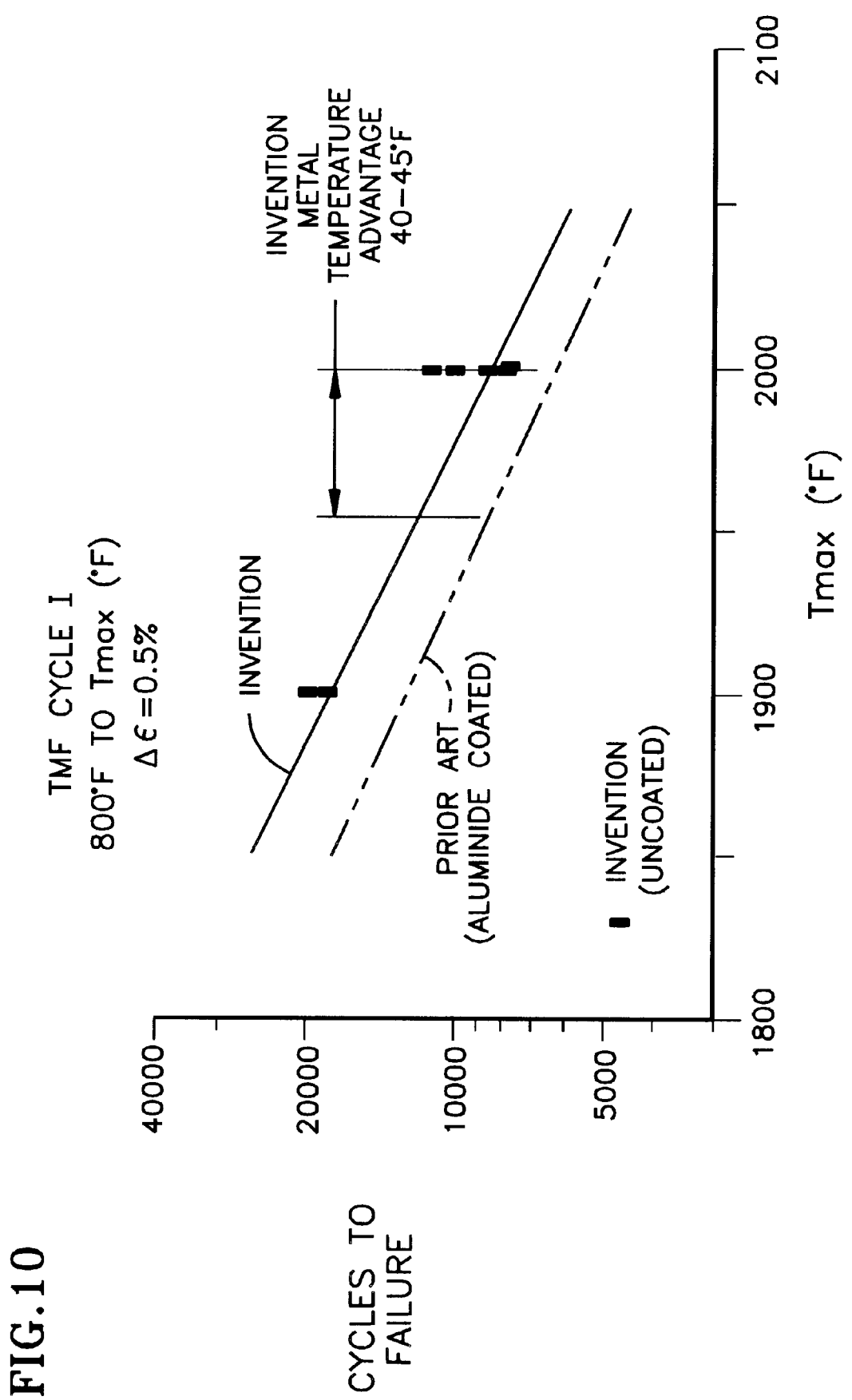
FIG. 10 is a plot illustrating the metal temperature advantage of the inventive alloy (uncoated) as contrasted with that of the prior art alloy (coated) in thermo-mechanical fatigue testing.

FIGS. 8 and 9 show the total strain range undergone by the test sample in each cycle as a function of the cycles required to produce failure. From the figures it can be seen that upon cycling between 800° F. and the maximum temperature, the invention requires about 40% more cycles at both 1900° F. and 2000° F. to produce failure when compared with the prior art coated composition. This corresponds to about a 40–45° F. temperature advantage over the prior art composition when plotted on the basis of cycles to failure vs. maximum test temperature at a constant strain range of 0.5%, as shown in FIG. 10. Thus, the inventive superalloy possesses an optimum combination of oxidation resistance, creep-rupture strength, and fatigue strength combined with good hot corrosion resistance which may enable components made therefrom to be used without a metallic coating for oxidation resistance thereon, for example, at elevated engine operating temperatures such as 1800° F. to about 2100° F.

Figure 11:
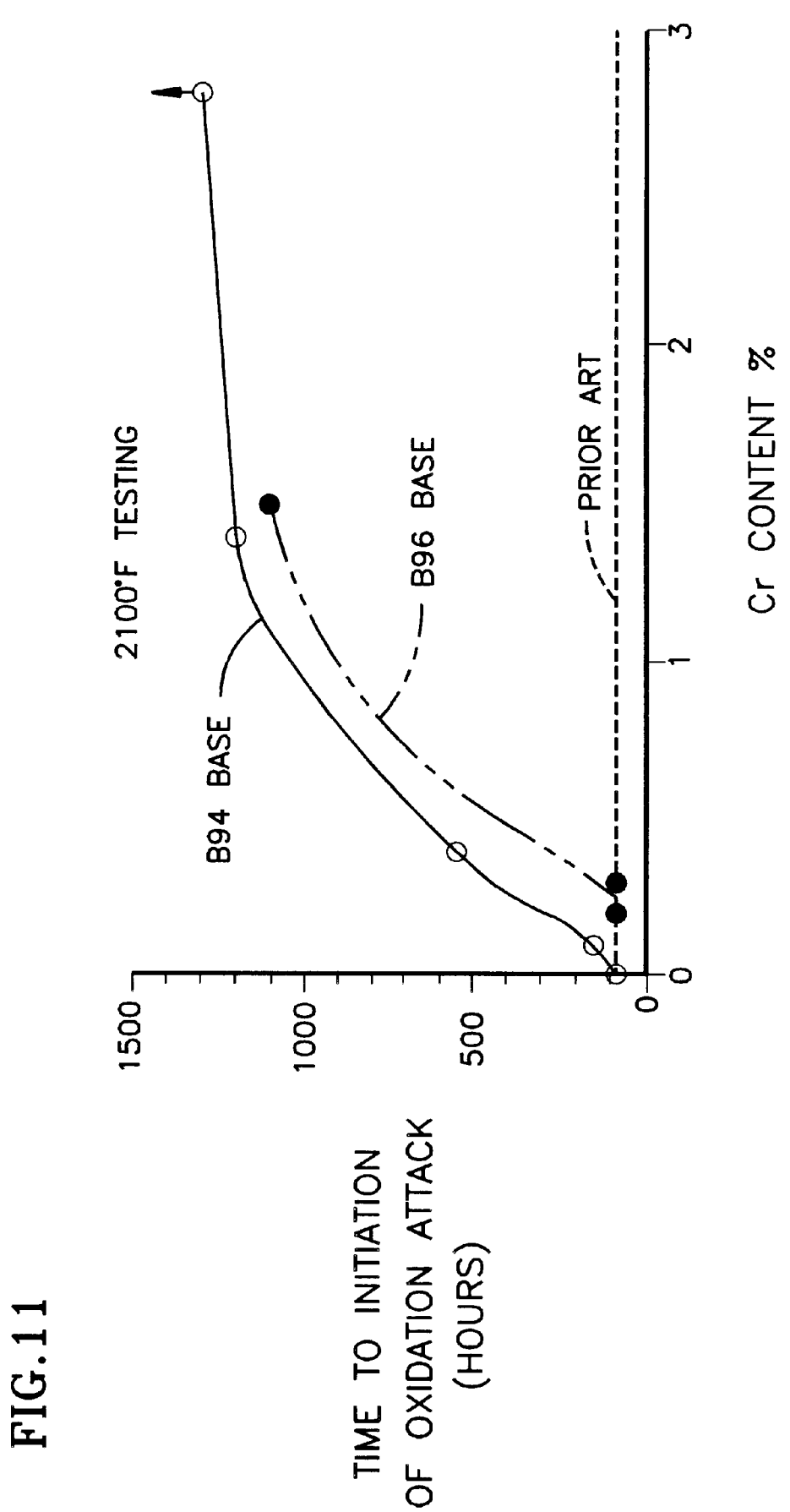
FIG. 11 is a plot illustrating the effect of chromium content on oxidation resistance.

Another advantage of the invention is the excellent oxidation resistance exhibited by this material in an uncoated state, combined with good hot corrosion resistance despite a low chromium content. As shown in FIG. 11, chromium additions up to 2.8% made to chromium-free base alloys (B94 and B96) significantly enhanced the oxidation resistance of these alloys. What was unexpected was that a minimum chromium content of 0.4% was necessary before significant enhancements to oxidation resistance were achieved. Some relative data may be found in Table IV where the alloys are compared on the basis of time (hours) to initiate oxidation attack at 2100° F. (all elemental values are expressed as weight percent unless otherwise indicated).

TABLE IV

| Alloy | Cr | Mo | W | Re | Ta | Al | Hf | Co | Yppm | Ni | Hrs to .25 gram wt loss |
|---|---|---|---|---|---|---|---|---|---|---|---|
| B94   | 0.0 | 2.3 | 6.5 | 6.6 | 5.8 | 5.8  | 0.1 | 10.1 | 10  | Bal | <86 |
| B94M1 | 0.1 | 2.3 | 6.5 | 6.6 | 5.8 | 5.8  | 0.1 | 10.1 | 110 | Bal | 150 |
| B94M2 | 0.4 | 2.3 | 6.5 | 6.6 | 5.8 | 5.8  | 0.1 | 10.1 | 200 | Bal | 546 |
| B94M3 | 1.4 | 2.3 | 6.5 | 6.6 | 5.8 | 5.8  | 0.1 | 10.1 | 50  | Bal | 1200 |
| B94M4 | 2.8 | 2.3 | 6.5 | 6.6 | 5.8 | 5.8  | 0.1 | 10.1 | 40  | Bal | 1300+ |
| B96M1 | 0.2 | 2.0 | 6.7 | 8.3 | 5.1 | 5.1  | 0.1 | 10.1 | 40  | Bal | <86 |
| B96M2 | 0.3 | 2.0 | 6.7 | 8.3 | 5.1 | 5.1  | 0.1 | 10.1 | 60  | Bal | <86 |
| B96M3 | 1.5 | 2.0 | 6.7 | 8.3 | 5.1 | 5.1  | 0.1 | 10.1 | 70  | Bal | 1100 |
| **    | 5.0 | 1.9 | 5.9 | 3.0 | 8.7 | 5.65 | 0.1 | 10.0 | —   | Bal | <86 |

** Prior art alloy of U.S. Pat. No. 4,719,080

Yet another advantage is that superalloy articles of the invention exhibit good microstructural stability even after long time exposure at elevated temperatures such as about 1900° F.

It should be understood that the invention is not limited to the particular embodiments shown and described herein, but that various changes and modifications may be made without departing from the spirit and scope of the invention as defined by the following claims.

What is claimed is:

1. A nickel base superalloy composition particularly suited for fabrication of single crystal articles consisting essentially of, in weight percent, 3.0–20.0% cobalt, 5.0–10.0% tungsten, 5.0–7.0% aluminum, 0.4–2.8% chromium, 4.0–8.0% tantalum, 0–1.0% vanadium, 0–7.5% rhenium, 0–1.5% titanium, 0–3.0% hafnium, 0–4.0% molybdenum, 0–2.0% niobium, 0–10.0% of one or more elements selected from the group consisting of ruthenium, palladium, platinum, rhodium, iridium and osmium, 0–1.0% of one or more elements selected from the group consisting of yttrium, lanthanum, scandium, cerium, lanthanide or actinide series of elements, balance essentially nickel, characterized by $P=-200\ Cr+80\ Mo-20\ Mo^2+200\ W-14\ W^2+30\ Ta-1.5\ Ta^2+2.5\ Co+1200\ Al-100\ Al^2+100\ Re+1000\ Hf-2000\ Hf^2+700\ Hf^3$ where P is $\geq 4500$, wherein all elemental values are in weight percent.

2. A nickel base superalloy composition particularly suited for fabrication of single crystal articles consisting essentially of, in weight percent, 5.0–15.0% cobalt, 6.0–8.0% tungsten, 5.3–6.3% aluminum, 0.8–2.5% chromium, 5.0–7.0% tantalum, 0–1.0% vanadium, 5.0–7.5% rhenium, 0–1.0% titanium, 0.1–1.5% hafnium, 0.5–3.0% molybdenum, 0–1.0% niobium, 0–10.0% of one or more elements selected from the group consisting of ruthenium, palladium, platinum, rhodium, iridium and osmium, 0.001–0.05% of one or more elements selected from the group consisting of yttrium, lanthanum, scandium, cerium, lanthanide or actinide series of elements, balance essentially nickel, characterized by P=−200 Cr +80 Mo−20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$ where P is ≧4700, wherein all elemental values are in weight percent.

3. A nickel base superalloy composition particularly suited for fabrication of single crystal articles consisting essentially of, in weight percent, 7.0–13.0% cobalt, 6.3–7.3% tungsten, 5.7–6.3% aluminum, 1.0–2.0% chromium, 5.5–6.5% tantalum, 0–0.5% vanadium, 6.0–7.0% rhenium, 0–1.0% titanium, 0.3–0.5% hafnium, 1.5–2.5% molybdenum, 0–1.0% niobium, 0–10.0% of one or more elements selected from the group consisting of ruthenium, palladium, platinum, rhodium, iridium and osmium, 0.001–0.05% of one or more elements selected from the group consisting of yttrium, lanthanum, scandium, cerium, lanthanide or actinide series of elements, balance essentially nickel, characterized by P=−200 Cr +80 Mo−20 Mo$^2$+200 W−14 W$^2$+30 Ta−1.5 Ta$^2$+2.5 Co +1200 Al−100 Al$^2$+100 Re+1000 Hf−2000 Hf$^2$+700 Hf$^3$ where P is >4800, wherein all elemental values are in weight percent.

4. A nickel base superalloy composition particularly suited for fabrication of single crystal articles consisting essentially of, in weight percent, 7.0–13.0% cobalt, 6.3–7.3% tungsten, 5.7–6.3% aluminum, 1.0–1.75% chromium, 5.5–6.5% tantalum, 0% vanadium, 6.0–7.0% rhenium, 0% titanium, 0.3–0.5% hafnium, 1.5–2.5% molybdenum, 0% niobium, 0–10.0% of one or more elements selected from the group consisting of ruthenium, palladium, platinum, rhodium, iridium and osmium, 0.001–0.05% of yttrium, balance essentially nickel, characterized by P=−200 Cr+80 Mo−20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$ where P is ≧4900, wherein all elemental values are in weight percent.

5. A nickel base single crystal superalloy article consisting essentially of, in weight percent, 3.0–20.0% cobalt, 5.0–10.0% tungsten, 5.0–7.0% aluminum, 0.4–2.8% chromium, 4.0–8.0% tantalum, 0–1.0% vanadium, 0–7.5% rhenium, 0–1.5% titanium, 0–3.0% hafnium, 0–4.0% molybdenum, 0–2.0% niobium, 0–10.0% of one or more elements selected from the group consisting of ruthenium, palladium, platinum, rhodium, iridium and osmium, 0–1.0% of one or more elements selected from the group consisting of yttrium, lanthanum, scandium, cerium, lanthanide or actinide series of elements, balance essentially nickel, characterized by P=−200 Cr +80 Mo−20 M$^2$+200 W−14 W$^2$+30 Ta−1.5 Ta$^2$+2.5 Co+1200 Al−100 Al$^2$+100 Re+1000 Hf−2000 Hf$^2$+700 Hf$^3$ where P is ≧4500, wherein all elemental values are in weight percent.

6. The article as in claim 5 wherein the article is a gas turbine engine component used in gas turbine engine operation, said component having no metallic coating for oxidation resistance thereon.

7. A nickel base single crystal superalloy article consisting essentially of, in weight percent, 5.0–15.0% cobalt, 6.0–8.0% tungsten, 5.3–6.3% aluminum, 0.8–2.5% chromium, 5.0–7.0% tantalum, 0–1.0% vanadium, 5.0–7.5% rhenium, 0–1.0% titanium, 0.1–1.5% hafnium, 0.5–3.0% molybdenum, 0–1.0% niobium, 0–10.0% of one or more elements selected from the group consisting of ruthenium, palladium, platinum, rhodium, iridium and osmium, 0.001–0.05% of one or more elements selected from the group consisting of yttrium, lanthanum, scandium, cerium, lanthanide or actinide series of elements, balance essentially nickel, characterized by P=−200 Cr+80 Mo−20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$ where P is ≧4700, wherein all elemental values are in weight percent.

8. The article as in claim 7 wherein the article is a gas turbine engine component used in gas turbine engine operation, said component having no metallic coating for oxidation resistance thereon.

9. A nickel base single crystal superalloy article consisting essentially of, in weight percent, 7.0–13.0% cobalt, 6.3–7.3% tungsten, 5.7–6.3% aluminum, 1.0–2.0% chromium, 5.5–6.5% tantalum, 0–0.5% vanadium, 6.0–7.0% rhenium, 0–1.0% titanium, 0.3–0.5% hafnium, 1.5–2.5% molybdenum, 0–1.0% niobium, 0–10.0% of one or more elements selected from the group consisting of ruthenium, palladium, platinum, rhodium, iridium and osmium, 0.001–0.05% of one or more elements selected from the group consisting of yttrium, lanthanum, scandium, cerium, lanthanide or actinide series of elements, balance essentially nickel, characterized by P=−200 Cr+80 Mo−20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$ where P is ≧4800, wherein all elemental values are in weight percent.

10. The article as in claim 9 wherein the article is a gas turbine engine component used in gas turbine engine operation, said component having no metallic coating for oxidation resistance thereon.

11. A nickel base superalloy composition consisting essentially of, in weight percent, 3.0–20.0% cobalt, 5.0–10.0% tungsten, 5.0–7.0% aluminum, 0.4–2.9% chromium, 4.0–8.0% tantalum, 0–1.0% vanadium, 0–7.5% rhenium, 0–1.5% titanium, 0–3.0% hafnium, 0–4.0% molybdenum, 0–2.0% niobium, 0–10.0% of one or more elements selected from the group consisting of ruthenium, palladium, platinum, rhodium, iridium and osmium, 0–1.0% of one or more elements selected from the group consisting of yttrium, lanthanum, scandium, cerium, lanthanide or actinide series of elements, balance essentially nickel.

12. The nickel base superalloy composition of claim 11, wherein said composition is suitable for use in single crystal articles.

13. The nickel base superalloy composition of claim 11, containing from about 0.4–2.8% chromium.

14. The nickel base superalloy composition of claim 11, containing from about 0.4–2.5% chromium.

15. The nickel base superalloy composition of claim 11, containing from about 0.4–1.75% chromium.

16. The nickel base superalloy composition of claim 11, wherein said composition is characterized by P=−200 Cr+80 Mo −20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$, where P is ≧4500, wherein all elemental values are in weight percent.

17. The nickel base superalloy composition of claim 11, wherein said composition is characterized by P=−200 Cr+80 Mo −20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$, where P is ≧4700, wherein all elemental values are in weight percent.

18. The nickel base superalloy composition of claim 11, wherein said composition is characterized by P=−200 Cr+80

Mo −20 Mo$^2$+200 W−14 W$^2$+30 Ta−1.5 Ta$^2$+2.5 Co+1200 Al−100 Al$^2$+100 Re+1000 Hf−2000 Hf$^2$+700 Hf$^3$, where P is ≧4800, wherein all elemental values are in weight percent.

19. A nickel base single crystal superalloy article comprising the composition of claim 11.

20. The nickel base superalloy composition of claim 11, containing from about 1.0% to 1.75% chromium.

* * * * *

UNITED STATES PATENT AND TRADEMARK OFFICE
CERTIFICATE OF CORRECTION

PATENT NO : 6,007,645
DATED : 12/28/99
INVENTOR(S): Alan D. Cetel et al.

It is certified that error appears in the above-identified patent and that said Letters Patent is hereby corrected as shown below:

Claim 3, column 9, line 29, change "$> 4800$" to -- $\geq 4800$ --.

Signed and Sealed this

Eighth Day of August, 2000

Attest:

Q. TODD DICKINSON

*Attesting Officer*　　　*Director of Patents and Trademarks*